(12) United States Patent
Cubaines

(10) Patent No.: US 9,379,636 B2
(45) Date of Patent: Jun. 28, 2016

(54) CURRENT GENERATOR AND METHOD FOR GENERATING CURRENT PULSES

(71) Applicant: GEO27 S.A.R.L., Luxembourg (LU)

(72) Inventor: Fabrice Cubaines, Saint-Jean Lagineste (FR)

(73) Assignee: GEO27 S.àr.l., Luxembourg (LU)

( * ) Notice: Subject to any disclaimer, the term of this patent is extended or adjusted under 35 U.S.C. 154(b) by 66 days.

(21) Appl. No.: 14/388,807

(22) PCT Filed: Mar. 29, 2013

(86) PCT No.: PCT/EP2013/056832
§ 371 (c)(1),
(2) Date: Sep. 28, 2014

(87) PCT Pub. No.: WO2013/144350
PCT Pub. Date: Oct. 3, 2013

(65) Prior Publication Data
US 2015/0085545 A1 Mar. 26, 2015

(30) Foreign Application Priority Data

Mar. 30, 2012 (FR) ..................................... 12 52913

(51) Int. Cl.
  *H02M 7/06* (2006.01)
  *H03K 3/021* (2006.01)
  *H01J 37/32* (2006.01)

(52) U.S. Cl.
CPC ........... *H02M 7/06* (2013.01); *H01J 37/32027* (2013.01); *H01J 37/32045* (2013.01); *H03K 3/021* (2013.01)

(58) Field of Classification Search
CPC ..................... H01J 37/32027; H01J 37/32045; H03K 3/021; H02M 7/06; H02M 2001/0077; H02M 2001/0093; H02M 1/08; H02M 5/4585
See application file for complete search history.

(56) References Cited

U.S. PATENT DOCUMENTS

| 7,808,125 B1 * | 10/2010 | Sachdeva ................ H02M 7/49 307/30 |
| 2004/0032212 A1 | 2/2004 | Yuzurihara et al. |
| 2013/0003423 A1 * | 1/2013 | Song ................. H02M 3/33584 363/21.02 |

FOREIGN PATENT DOCUMENTS

| EP | 1501176 A2 | 1/2005 |
| WO | 03079397 A1 | 9/2003 |

* cited by examiner

*Primary Examiner* — Jessica Han
*Assistant Examiner* — Demetries A Gibson
(74) *Attorney, Agent, or Firm* — Im IP Law PLLC; C. Andrew Im

(57) ABSTRACT

A method for generating current pulses and a current generator having a plurality of secondary stages. Each secondary stage has a DC voltage source and a switching circuit having four switches, connected together so as to form a line. One secondary stage being designated as a regulator stage has a regulator circuit having a smoothing inductor, a switch arranged between a terminal of the smoothing inductor and the DC voltage source, and a circuit for connecting the terminal of the smoothing inductor to the switching circuit when the switch of the regulator circuit is in a locked state. A control circuit of the current generator controls the switches of the switching circuits and the switch of the regulator circuit.

10 Claims, 1 Drawing Sheet

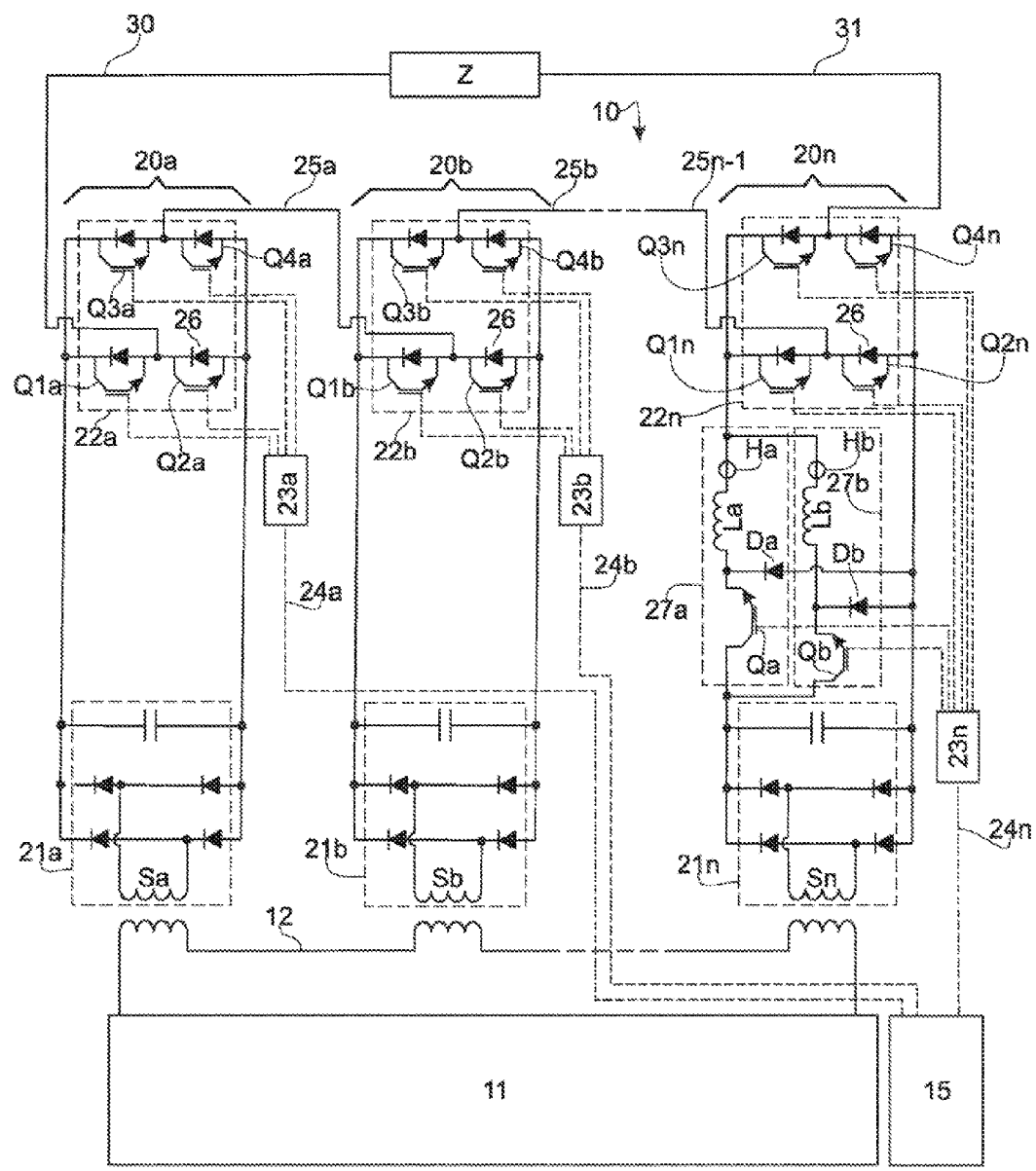

CURRENT GENERATOR AND METHOD FOR GENERATING CURRENT PULSES

RELATED APPLICATIONS

This application is a §371 application from PCT/EP2013/056832 filed Mar. 29, 2013, which claims priority from French Patent Application No. 12 52913 filed Mar. 30, 2012, each of which is herein incorporated by reference in its entirety.

TECHNICAL FIELD

The present invention relates to the field of electrical signal generation, and concerns more particularly a current generator suitable for applying high-voltage, high regulated intensity current pulses to the terminals of a load.

PRIOR ART

In many applications, there is in fact a need to subject a load to regulated intensity current pulses.

This is, for example, the case with applications such as electrolysis, sterilization, the obtaining of plasmas, the characterization of soils, etc.

For example, it is known to apply current pulses to a load with a polarity alternating from one current pulse to another, obtained by sometimes applying a positive and sometimes a negative voltage to the terminals of the load. Two consecutive current pulses may furthermore be separated by a time interval, referred to as the "relaxation interval", during which no current is applied to the terminals of the load.

During each relaxation interval, the response of the load to the previously applied current pulse is measured, and the characteristics (resistivity, dielectric constant, etc.) of the load are then determined by comparing the responses measured with the applied current pulses.

Each current pulse occurs on the whole in the form of a timeslot which breaks down into three main phases:
a current pulse establishment phase,
an actual current pulse phase during which the value of the current is regulated around a predefined current pulse reference value,
a current pulse extinction phase.

The precision of the characterization of the load depends notably on the precision with which the current value is regulated around the predefined current intensity reference value. Furthermore, the shorter the duration of the current pulse extinction phase, the more precise the characterization will be. This is also the case, to a lesser extent, for the current pulse establishment phase.

Furthermore, the impedance of a soil may be very high, such that it may prove necessary to have to generate high regulated intensity current pulses, in the order of several tens of amperes, under a high voltage, in the order of several kilovolts.

Such constraints are generally incompatible with those of regulating precision and short duration of the extinction phase.

Known current generators are in fact limited to a reduced range and produce voltages limited to several hundreds of volts and currents limited to several hundreds of milliamperes.

A need therefore exists for a current generator enabling the generation of current pulses of several tens of amperes of intensity regulated with a high precision, under a high voltage and with very short extinction phases.

DESCRIPTION OF THE INVENTION

The object of the present invention is to overcome all or some of the limitations of the prior art solutions, notably those described above, by proposing a solution that enables the generation of high-value current pulses (several tens of amperes) regulated with a similarly high precision (in the order of percent).

Furthermore, the object of the present invention is also to propose a solution that enables the generation of current pulses with short extinction phases (in the order of milliseconds), including for high current pulses (several tens of amperes).

For this purpose, and according to a first aspect, the invention relates to a current generator, suitable for supplying regulated-intensity current pulses to the terminals of a load. Said current generator comprises a plurality of secondary stages in which:
each secondary stage comprises a DC voltage source isolated from the voltage sources of the other secondary stages, and a switching circuit comprising four switches disposed as two half-bridges, each formed from two switches mounted in series between terminals of the voltage source,
the switching circuits are interconnected in such a way as to form a chain, a midpoint of a half-bridge of each secondary stage being connected to a midpoint of a half-bridge of a secondary stage downstream in this chain, the two secondary stages at the ends of said chain each comprising a midpoint of a half-bridge intended to be connected to a terminal of the load,
a secondary stage, referred to as the "regulator stage", comprises, between the voltage source and the switching circuit, a regulator circuit comprising a smoothing inductor, a switch disposed between a terminal of the smoothing inductor and the voltage source, and a means suitable for connecting said terminal of the smoothing inductor to the switching circuit when the switch of the regulator circuit is in an OFF state.

The current generator further comprises a control circuit suitable for controlling the switches of the switching circuits and the switch of the regulator circuit. The control circuit is preferably configured so that, during the generation of a current pulse, it:
controls the switches of the switching circuits of the secondary stages in order to dispose in series the voltage sources of a group of secondary stages, including the regulator stage, selected according to a current intensity reference value, and isolates the voltage sources of the unselected secondary stages,
controls successive switching of the switch of the regulator circuit in order to regulate the intensity of a current flowing in the load around the reference value.

Due to the switching circuits and the manner in which they are interconnected, it is possible, according to the control applied to the switches of a switching circuit, to dispose the voltage source of the secondary stage concerned in series or in opposition with those of the other secondary stages, or to isolate the voltage source of the secondary stage concerned in relation to those of the other secondary stages, but without interrupting the flow of a current in the load.

It is then possible to select some secondary stages, including the regulator stage, referred to as the "active stages", and to dispose them in series by a suitable control of the switching circuit switches in order to obtain a voltage suitable for causing a required current to flow in the load, according to the impedance of the latter.

The active stages other than the regulator stage are, for example, chosen in such a way that the sum of their respective open-circuit voltages is lower than the voltage necessary to cause the required current to flow in the load, and in such a way that the sum of the respective voltages of all of the active stages (including the regulator stage) is greater than the voltage necessary to cause the required current to flow in the load.

It is thus possible to regulate the intensity of the current flowing in the load by means of the regulator stage alone. To do this, only the switch of the regulator circuit of the regulator stage is controlled during the generation of a current pulse.

In fact, when the switch of the regulator circuit is in an ON state, a terminal of the smoothing inductor is connected to the DC voltage source of the regulator stage, energy is stored in the smoothing inductor and the intensity of the current flowing in said smoothing inductor increases progressively. When the switch of the regulator circuit is in an OFF state, the terminal of the smoothing inductor, previously connected to the DC voltage source, is isolated from said DC voltage source. The regulator circuit also comprises a means suitable for connecting said terminal of the smoothing inductor to the switching circuit, such as a diode, a switch, etc., by which the smoothing inductor can be discharged, and the intensity of the current flowing in said smoothing inductor decreases progressively.

It is thus possible to cause the intensity of the current flowing in the load to fluctuate around the reference value through successive switching of the switch of the regulator circuit. Furthermore, during the generation of a current pulse, only the switch of the regulator circuit is switched to a high frequency, thus enabling the power dissipated by the successive switching to be limited.

In particular embodiments, the current generator comprises one or more of the following characteristics, taken in isolation or according to all technically possible combinations.

In one particular embodiment, the control circuit is configured so that, between the generation of two current pulses, it:
controls the switching circuit of the regulator stage to set all the switches of a half-bridge to an ON state,
controls successive switching of the switch of the regulator circuit in order to regulate the intensity of a current flowing in the switching circuit of the regulator stage around a non-zero value.

Such measures are particularly advantageous in that they enable a reduction of the respective durations of the establishment and extinction phases of a current pulse in the load.

It should be noted that, according to the prior art, it was customary to mount a smoothing inductor at the output of the current generator, in series with the load to be characterized, in order to smooth the current supplied to said load. However, the addition of a smoothing inductor of this type at the output of the current generator helped to increase the respective durations of the establishment and extinction phases of the current pulses in the load.

The current generator according to the invention comprises a smoothing inductor integrated into the regulator circuit of the regulator stage in such a way that it is no longer necessary to mount a smoothing inductor at the output of the current generator. Between the generation of two current pulses, the output of the regulator circuit of the regulator stage is short-circuited in such a way that it is possible to cause a current to flow in the switching circuit of the regulator stage without said current flowing in the load and interfering with the measurement, in contrast to the prior art.

By regulating the intensity of the current flowing in the switching circuit (short circuit) around a non-zero value, it will be possible to reduce the respective durations of the establishment and extinction phases of the current pulses. In fact, if, for example, the establishment phase of a current pulse is considered, the current flowing at the beginning of the establishment phase will have an intensity more or less equal to the non-zero value concerned, and will increase until it reaches more or less the reference value. The duration of the establishment phase obviously depends on the difference between said non-zero value and said reference value, and the latter is lower when considering a non-zero initial value than when considering a zero initial value.

In one particular embodiment, the control circuit is configured so that, between the generation of two current pulses, it regulates the intensity of the current flowing in the switching circuit of the regulator stage around the reference value.

Such measures are particularly advantageous in that they minimize the respective durations of the establishment and extinction phases of the current pulses, since the initial and final values are both more or less equal to the reference value, to within the precision of the regulation.

In one particular embodiment, the regulator phase comprises, between the voltage source and the switching circuit, a plurality of regulator circuits disposed in parallel, each regulator circuit comprising a smoothing inductor, a switch disposed between a terminal of the smoothing inductor and the voltage source, and a means suitable for connecting said terminal of the smoothing inductor to the switching circuit when the switch of the regulator circuit is in an OFF state.

Furthermore, the control circuit is configured so that, during the generation of a current pulse, it controls successive switching of the respective switches of the regulator circuits of the regulator stage in order to regulate the intensity of the current flowing in the load around the reference value.

Such measures are advantageous in that they allow the dimensions required for each of the smoothing inductors to be reduced by reducing the current flowing in each of said smoothing inductors. In fact, the regulator circuits are disposed in parallel in such a way that the current flowing in the load is more or less equal to the sum of the currents flowing in each of the smoothing inductors.

In one particular embodiment:
the number of regulator circuits of the regulator stage is equal to two and the smoothing inductors of said two regulator circuits have the same characteristics,
the control circuit is configured so that, during the generation of a current pulse, it controls the respective switches of the two regulator circuits in such a way that, when one of said switches is in an ON state, the switch of the other regulator circuit is in an OFF state, the respective switches of the regulator circuits being controlled alternately to the ON state during successive time intervals of the same duration.

Such measures are advantageous in that they enable a greater precision of the regulation of the intensity of the current flowing in the load.

In fact, and as previously indicated, the successive switching of the switch of a switch of the regulator circuit causes the intensity of the current flowing in the smoothing inductor of this regulator circuit to fluctuate around a value more or less equal to half of the reference value (the current flowing in the load being equal to the sum of the currents flowing in each of the regulator circuits). By controlling the switching of the two regulator circuits in this way, the fluctuations in the two regulator circuits will be more or less in phase opposition, in such a way that the fluctuations in the intensity of the current flowing in the load will be substantially reduced.

In one particular embodiment, the voltage sources of the secondary stages have a staging of their respective output voltages. Such measures allow the intensity of the current to be adjusted for a wide range of impedances.

In one particular embodiment, the switches of the switching circuits and of each regulator circuit are insulated gate bipolar transistors. Such measures are advantageous in that the insulated gate bipolar transistors (IGBT) allow high voltages and/or high currents to be switched without requiring a high control energy, which allows them to be controlled by means of a simple control stage having a low power consumption.

According to a second aspect, the invention relates to a method for generating current pulses on the terminals of a load, in which the generation of current pulses is carried out by means of a current generator comprising a plurality of secondary stages in which:
- each secondary stage comprises a DC voltage source isolated from the voltage sources of the other secondary stages, and a switching circuit comprising four switches disposed as two half-bridges, each formed from two switches mounted in series between terminals of the voltage source,
- the switching circuits are interconnected in such a way as to form a chain, a midpoint of a half-bridge of each secondary stage being connected to a midpoint of a half-bridge of a secondary stage downstream in this chain, the two secondary stages at the ends of said chain each comprising a midpoint of a half-bridge intended to be connected to a terminal of the load,
- a secondary stage, referred to as the "regulator stage", comprises, between the voltage source and the switching circuit, a regulator circuit comprising a smoothing inductor, a switch disposed between a terminal of the smoothing inductor and the voltage source, and a means suitable for connecting said terminal of the smoothing inductor to the switching circuit when the switch of the regulator circuit is in an OFF state.

Furthermore, the method for generating current pulses comprises, in order to generate a current pulse, steps of:
- selecting a group of secondary stages, including the regulator stage, referred to as the "active stages", according to a current intensity reference value,
- controlling the switches of the switching circuits of the secondary stages in order to dispose in series the voltage sources of the active stages and to isolate the voltage sources of the unselected secondary stages,
- controlling successive switching of the switch of the regulator circuit in order to regulate the intensity of a current flowing in the load around the reference value.

In particular embodiments, the method for generating current pulses comprises one or more of the following characteristics, taken in isolation or according to all technically possible combinations.

In one particular embodiment, the method for generating current pulses comprises, between the generation of two current pulses, steps of:
- controlling the switching circuit of the regulator stage in order to set all the switches of a half-bridge to an ON state,
- controlling successive switching of the switch of the regulator circuit in order to regulate the intensity of a current flowing in the switching circuit of the regulator stage around a non-zero value.

In one particular embodiment, the regulator stage comprising two regulator circuits mounted in parallel and respective smoothing inductors having the same characteristics, the respective switches of the two regulator circuits are controlled during the generation of a current pulse in such a way that, when one of said switches is in an ON state, the switch of the other regulator circuit is in an OFF state, the respective switches of the regulator circuits being controlled alternately to the ON state during successive time intervals of the same duration.

DESCRIPTION OF THE FIGURES

The invention will be better understood from a reading of the following description, given as a non-limiting example and referring to the figures in which:

FIG. 1: shows a schematic representation of a particular embodiment of a current generator according to the invention, FIG. 2: shows time diagrams illustrating schematically the implementation of the current generator from FIG. 1.

DETAILED DESCRIPTION OF EMBODIMENTS

FIG. 1 shows a particular embodiment of a current generator 10.

As shown in FIG. 1, the current generator 10 comprises a plurality of secondary stages 20 (20a-20n) each including a DC voltage source 21 and a switching circuit 22.

In the following description, the corresponding elements of different secondary stages are denoted by the same reference. When it is necessary to distinguish an element of one secondary stage from a corresponding element of a different secondary stage, the corresponding reference is accompanied by an alphabetical index specific to the secondary stage concerned. When it is not necessary to distinguish the secondary stage to which an element belongs, only the generic reference, without an index, is used. For example, the switching circuit of the secondary stage 20a will be denoted by 22a (the switching circuit of the secondary stage 20b will be denoted by 22b, etc.). Considered in a general manner, the switching circuit of any given secondary stage 20 will be denoted by 22.

In the example shown in FIG. 1, each DC voltage source 21 includes a secondary winding S (Sa–Sn) of a single-phase transformer 11 of which the primary winding 12 is powered by a primary stage (not shown in FIG. 1) in such a way that the DC voltage sources 21 are electrically isolated from one another. In this example, the single-phase alternating current supplied by the secondary winding S is full-wave rectified by a diode bridge and is filtered in a filtering capacitor of the DC voltage source 21.

By way of example, if the generation of current pulses with a maximum intensity of 600 amperes on an impedance load between 0.1 ohms and 50 kilohms is required, the current generator 10 comprises, for example, nine secondary stages 20 of which the no-load voltages are staged from 200 volts (V) 2000 V. For example, the current generator 10 comprises five secondary stages each supplying a voltage of 2000 V, the other four secondary stages respectively supplying voltages of 1000 V, 500 V, 300 V, and 200 V (for example the secondary stage 20n) and for a total maximum voltage in the order of 12 kilovolts (kV).

According to other examples, nothing excludes the possibility of having DC voltage sources 21 all supplying the same no-load voltage. In the case of a maximum required voltage of 12 kV, it is, for example, possible to provide twelve secondary stages 20, each supplying a no-load voltage of 1 kV.

Each switching circuit 22 comprises four switches Q1, Q2, Q3, Q4 disposed according to an assembly in the form of two parallel-mounted half-bridges. The switches Q1 and Q2 form a first half-bridge and are mounted in series between the terminals of the DC voltage source 21. The switches Q3 and Q4 form a second half-bridge and are also mounted in series between the terminals of said DC voltage source 21.

The switching circuits 22 are interconnected in such a way as to form a chain between terminals of the current generator 10.

More particularly, a midpoint of a half-bridge (i.e. a point between the two switches of this half-bridge) of each secondary stage 20 is connected to a midpoint of a half-bridge of a secondary stage downstream in this chain. The two secondary stages 20a, 20n at the ends of said chain each comprise a midpoint of a half-bridge intended to be connected to a terminal of the load Z.

In the example shown in FIG. 1, the midpoint of the half-bridge of the secondary stage 20a made up of the switches Q1a and Q2a forms a first terminal of the current generator 10 and is connected by a line 30 to a first terminal of the load Z. The midpoint of the half-bridge of the secondary stage 20a made up of the switches Q3a and Q4a is connected by a line 25a to the midpoint of the half-bridge of the secondary stage 20b made up of the switches Q1b and Q2b, etc. The switching circuits 22 of the secondary stages 20 are thus connected in series in such a way as to form the aforementioned chain between the secondary stage 20a and the secondary stage 20n. The midpoint of the half-bridge of the secondary stage 20n made up of the switches Q3n and Q4n forms a second terminal of the current generator 10 and is connected by a line 31 to a second terminal of the load Z.

The secondary stage 20n, also referred to below as the "regulator stage", is distinguished from the other secondary stages by the presence of two regulator circuits 27a, 27b mounted in parallel between the DC voltage source 21n and the switching circuit 22n.

In the example shown in FIG. 1, each regulator circuit 27a, 27b comprises:
 a smoothing inductor La, Lb,
 switch Qa, Qb,
 a diode Da, Db.

The regulator circuit 27a comprises a switch Qa mounted between a first terminal (positive pole) of the DC voltage source 21n and a first terminal of the smoothing inductor La, a second terminal of the smoothing inductor La being connected to the switches Q1n and Q3n of the switching circuit 22n. The regulator circuit 27a also comprises a diode Da of which the cathode is connected to the first terminal of the smoothing inductor La, and of which the anode is connected to a second terminal (negative pole) of the DC voltage source 21n and to the switches Q2n and Q4n of the switching circuit 22n.

The regulator circuit 27b correspondingly comprises a switch Qb mounted between the positive pole of the DC voltage source 21n and a first terminal of the smoothing inductor Lb, a second terminal of the smoothing inductor Lb being connected to the switches Q1n and Q3n of the switching circuit 22n. The switch Qb and the smoothing inductor Lb of the regulator circuit 27b are furthermore mounted in parallel with the switch Qa and the smoothing inductor La of the other regulator circuit 27a. The regulator circuit 27b also comprises a diode Db of which the cathode is connected to the first terminal of the smoothing inductor Lb, and of which the anode is connected to the negative pole of the DC voltage source 21n and to the switches Q2n and Q4n of the switching circuit 22n.

The regulator circuits 27a, 27b therefore have a make-up corresponding to that of the controllable part of a voltage step-down converter (also known as a "buck" converter).

It should be noted that each diode Da, Db can be replaced by any means suitable for connecting the first terminal of the smoothing inductor La, Lb to the switches Q2n and Q4n of the switching circuit 22n when the switch Qa, Qb is in an OFF state. According to one non-limiting example, the diode Da, Db of a regulator circuit 27a, 27b is replaced by a switch controlled to an ON state when the other switch Qa, Qb of the regulator circuit 27a, 27b is in an OFF state, and controlled to an OFF state when the other switch Qa, Qb of the regulator circuit 27a, 27b is in an ON state.

In the example shown in FIG. 1, each switch of the current generator 10 is implemented by means of an insulated gate bipolar transistor (IGBT) (or a group of IGBT transistors), chosen in a range suitable for the expected performance of the current generator 10.

Thus, for example, each switch is chosen to be suitable for allowing the flow of a current with an intensity of between 0 and 600 A in the ON state and to maintain a nominal voltage in the OFF state.

In the example shown in FIG. 1, the switches Q1, Q2, Q3, Q4 of each switching circuit 22 each comprise an anti-parallel diode 26 suitable for allowing the flow of a reverse current in these switches. A diode of this type is generally inherent in the construction of an IGBT transistor, but it may prove useful to double this inherent diode by means of an external anti-parallel diode 26, particularly if currents that can reach an intensity of 600 A are envisaged.

The current generator 10 also comprises a control circuit 15 suitable for controlling the switches Q1, Q2, Q3, Q4 of each switching circuit 22, and also the switches Qa, Qb of each regulator circuit 27a, 27b.

For this purpose, the control circuit 15 is connected to said switches of the secondary stages 20 of the current generator 10.

The description below presents the case in which the control circuit is connected to the switches of the secondary stages 20 via an optical-fiber connection. However, according to other examples not described, nothing excludes the possibility of considering other types of connections, such as, notably, electrical connections.

The use of optical-fiber connections is advantageous in that it ensures a better reliability of the current generator 10 than with electrical connections, insofar as the switching of high currents and/or high voltages is likely to interfere with electrical connections.

For example, in the case of IGBT transistor switches, the gates of the switches of the secondary stages 20 are connected to an optical converter 23 suitable for transforming a control received in optical form via an optical fiber 24 into an appropriate electrical control. The optical fibers 24a-24n carrying the respective controls of the secondary stages 20a-20n are connected at the end opposite to the optical converters 23a-23n to the control circuit 15.

The control circuit 15 is also connected (links not shown in FIG. 1) to means for determining the intensity of the current flowing in each of the smoothing inductors La, Lb, for example current sensors Ha, Hb (Hall effect, Rogowski coil, etc.). Furthermore, it is possible to provide a current sensor disposed on the line 30 or the line 31 (not shown in the figures) enabling the sum of the currents to be checked.

The control circuit 15 may be implemented in any manner known to the person skilled in the art. For example, the control circuit 15 comprises a processor and an electronic memory in which a computer program is stored, in the form of a set of program code instructions to be executed by the processor. In one variant, the control circuit 15 comprises FPGA, PLD, etc., programmable logic circuits and/or specialized integrated circuits (ASIC).

The control circuit 15 thus comprises a set of means configured through software (specific computer program product) and/or hardware (FPGA, PLD, ASIC, etc.) in order to implement the different steps of a method for generating current pulses.

The operation of the current generator 10 is explained here by describing the main states that a secondary stage 20 can assume according to the control applied to the switches Q1, Q2, Q3, Q4 of the switching circuit 22. In the description below, a direction of flow of the current is defined arbitrarily as positive when the current enters the load Z via the line 30 and leaves it again via the line 31.

When the control circuit 15, via the optical fiber 24a and the optical converter 23a, imposes an ON state on the switches Q1a and Q4a and an OFF state on the switches Q2a and Q3a of the secondary stage 20a, the positive pole of the DC voltage source 21a is connected to the load Z via the switch Q1a and the line 30. The negative pole of the DC voltage source 21a is connected to the midpoint of the half-bridge made up of the switches Q1b and Q2b of the secondary stage 20b via the switch Q4a and the line 25a. Assuming that the secondary stage 20b is controlled in a similar manner, the switch Q1b then connects the negative pole of the DC voltage source 21a to the positive pole of the DC voltage source 21b. Reasoning by analogy in respect of all of the secondary stages 20a-20n, it appears that all the DC voltage sources 21 are then mounted in series and cause a current to flow in a positive direction in the load Z.

Conversely, when the control circuit 15 imposes an ON state on the switches Q2a and Q3a and an OFF state on Q1a and Q4a, the negative pole of the DC voltage source 21a is then connected to the load Z via the line 30 and the positive pole of the DC voltage source 21a is then connected to the midpoint of the half-bridge made up of the switches Q1b and Q2b of the secondary stage 20b via the switch Q3a and the line 25a. Assuming that the secondary stage 20b is controlled in a similar manner, the switch Q2b then connects the positive pole of the DC voltage source 21a to the negative pole of the DC voltage source 21b. Reasoning by analogy in respect of all the secondary stages 20a-20n, it appears that all of the DC voltage sources 21 are then mounted in series and cause a current to flow in a negative direction in the load Z.

It is also possible to control the switches Q1, Q2, Q3, Q4 in such a way as to isolate the DC voltage source 21 from one or more secondary stages 20 of the load Z, but without interrupting the flow of a current in the chain of the secondary stages 20.

For example, it is assumed that most of the secondary stages have been controlled to cause a positive current to flow in the load and that the DC voltage source 21b of the secondary stage 20b is to be isolated. By controlling the switches Q1b and Q3b to the OFF state and the switch Q4b to the ON state, the current flows in the secondary stage 20b by entering via the line 25b at the midpoint of the half-bridge made up of the switches Q3b and Q4b, crossing Q4b and the anti-parallel diode 26 of the switch Q2b, and leaving the secondary stage 20b via the line 25a. It is thus evident that the DC voltage source 21b is isolated, i.e. it does not contribute to the voltage applied to the terminals of the load Z, but does not interrupt the flow of a current in the chain of the secondary stages 20. Moreover, the state of the switch Q2b is not determinant.

When the current in the load Z flows in the negative direction, the roles of the switches Q2b and Q4b are reversed, the current entering via the line 25a, crossing the switch Q2b, then necessarily in the ON state, and the anti-parallel diode of Q4b to leave once more via the line 25b.

Taking account of the symmetry of the switching circuit 22, it is possible to isolate the DC voltage source 21 of a secondary stage 20 by controlling the switches Q2 and Q4 to the OFF state and the switches Q1 and Q3 to the ON state according to the direction of the current in the load.

The table below summarizes the controls to be applied to the switches Q1, Q2, Q3, Q4 in order to insert the DC voltage source 21 respectively in series in the positive direction, in series in the negative direction, or to isolate said DC voltage source 21 according to the direction of flow of the current in the load Z.

| Q1 | ON | OFF | OFF | ON | OFF | X |
|---|---|---|---|---|---|---|
| Q2 | OFF | ON | X | OFF | ON | OFF |
| Q3 | OFF | ON | OFF | X | OFF | ON |
| Q4 | ON | OFF | ON | OFF | X | OFF |
| source 21 | direction+ | direction− | isolated (direction+) | | isolated (direction−) | |

FIG. 2 shows time diagrams illustrating an example embodiment of a current generator 10 according to the invention.

As previously shown, it may prove necessary, in order to characterize a load Z, to apply recurring current pulses of regulated intensity to said load Z, the polarity of which may alternate from one current pulse to the other.

Each current pulse appears overall in the form of a timeslot comprising, for example, a time interval of duration T1, referred to as the "pulse interval", during which a current pulse is applied to the load Z. The pulse interval is followed by a time interval of duration T2, referred to as the "relaxation interval", during which no current is applied to the load Z. The durations T1 and T2 are, for example, equal and adjustable.

An example embodiment of the current generator 10 shown in FIG. 1 is first described during a pulse interval, i.e. during the generation of a current pulse.

According to the load Z to be characterized, a reference current intensity value is defined in a conventional manner for each current pulse. The current pulses are preferably regulated, as an absolute value, around the same reference value IC. The reference value IC is, for example, adjustable between 0 and 600 A in steps of 0.1 A.

The control circuit 15 is suitable for controlling the switches Q1 to Q4 of the secondary stages 20 in order to dispose in series at least one secondary stage 20, including the regulator stage 20n, and to establish a current in the load Z. According to measurements of the intensity of the current flowing in the load Z, for example carried out by the current sensors Ha and Hb of the regulator circuits 27a, 27b, the control circuit 15 is configured to implement two distinct and complementary regulating strategies for the generation of a current pulse with an intensity regulated around the reference value.

The first regulating strategy consists in carrying out an approximate regulation of the intensity of the current flowing in the load Z. To do this, the control circuit 15 selects, according to the estimated impedance of the load Z, a group of secondary stages 20, including the regulator stage 20n, referred to as the "active stages".

The active stages are selected in such a way that:
  the sum of the respective voltages of the active stages other than the regulator stage 20n is lower than the voltage required to cause a current with an intensity IC to flow in the load Z, the sum of the respective voltages of all the active stages (including the regulator stage 20n) is higher than the voltage required to cause a current with an intensity IC to flow in the load Z.

The switches Q1, Q2, Q3, Q4 of the switching circuits 22 of the active stages are then controlled so that these active stages are connected in series, by controlling their switches Q1 and Q4 to the ON state and the switches Q2 and Q3 to the OFF state. The switches Q1, Q2, Q3, Q4 of the switching circuits 22 of the unselected secondary stages 20 are controlled in such a way as to isolate their DC voltage sources 21 from the load Z.

The second strategy consists in performing a precise regulation of the intensity of the current flowing in the load Z. To do this, the control circuit 15 imposes successive switching, during the pulse interval, on the switches Qa, Qb of the regulator circuits 27a, 27b in order to regulate the intensity of the current flowing in the load Z around the reference value IC for the duration T1 of said pulse interval.

It is assumed, in a non-limiting manner, that the two smoothing inductors La, Lb have more or less the same time constant (mainly determined by the inductive and resistive characteristics of said smoothing inductors La, Lb).

Advantageously, during a pulse interval, the switches Qa, Qb of the regulator circuits 27a, 27b are controlled in such a way that, when one of said switches is in an ON state, the switch of the other regulator circuit is in the OFF state, the respective switches Qa, Qb of the regulator circuits 27a, 27b being controlled alternately to the ON state during successive time intervals IT1, IT2 of the same duration. The duration of these time intervals IT1, IT2 is determined according to the tolerated fluctuation $\Delta IC$ for the intensity of the current flowing in each smoothing inductor La, Lb.

Part a) of FIG. 2 shows the change over time in the intensity of the current IA flowing in the smoothing inductor La, whereas part b) of FIG. 2 shows the change over time in the intensity of the current IB in the smoothing inductor Lb.

It should be noted that, in FIG. 2, it is assumed, for the sake of clarity of the figures, that the duration T1 of the pulse interval corresponds to four time intervals (IT1, IT2, IT1, IT2). In practice, the duration of the time intervals IT1, IT2 may be much less than the duration T1 (for example in the order of tens of microseconds for the time intervals IT1, IT2, and in the order of seconds for the pulse interval of duration T1).

During a time interval IT1, the switch Qa of the regulator circuit 27a is controlled to the ON state. The first terminal of the smoothing inductor La and the cathode of the diode Da are then connected to the positive pole of the DC voltage source 21n. The diode Da does not allow current to flow and the intensity of the current IA in the smoothing inductor La increases progressively from the value $(IC/2-\Delta IC/2)$ to the value $(IC/2+\Delta IC/2)$, which is reached towards the end of the time interval IT1.

During a time interval IT1, the switch Qb of the regulator circuit 27b is controlled to the OFF state. The first terminal of the smoothing inductor Lb is isolated from the positive pole of the DC voltage source 21n and the current flows in the diode Db. The intensity of the current IB in the smoothing inductor Lb decreases progressively from the value $(IC/2+\Delta IC/2)$ to the value $(IC/2-\Delta IC/2)$, which is reached towards the end of the time interval IT1.

During a time interval IT2, the switch Qa of the regulator circuit 27a is controlled to the OFF state. The first terminal of the smoothing inductor La is isolated from the positive pole of the DC voltage source 21n and the current flows in the diode Da. The intensity of the current IA in the smoothing inductor La decreases progressively from the value $(IC/2+\Delta IC/2)$ to the value $(IC/2-\Delta IC/2)$, which is reached towards the end of the time interval IT2.

During a time interval IT2, the switch Qb of the regulator circuit 27b is controlled to the ON state. The first terminal of the smoothing inductor Lb and the cathode of the diode Db are then connected to the positive pole of the DC voltage source 21n. The diode Db does not allow current to flow and the intensity of the current IB in the smoothing inductor Lb increases progressively from the value $(IC/2-\Delta IC/2)$ to the value $(IC/2+\Delta IC/2)$, which is reached towards the end of the time interval IT2.

As shown by parts a) and b) of FIG. 2, during a pulse interval, the fluctuations in the intensities of the currents IA, IB flowing in the smoothing inductors La, Lb respectively are then more or less in phase opposition.

Part c) of FIG. 2 shows the change over time in the intensity of the current IZ flowing in the load Z which corresponds, during the pulse interval of duration T1, more or less to the sum of the currents IA, IB flowing respectively in the smoothing inductors La, Lb.

Since the fluctuations in the intensities of the currents IA, IB are more or less in phase opposition, they tend to mutually cancel one another when the currents IA, IB are added together. Consequently, during the pulse interval, the intensity of the current IZ flowing in the load Z is regulated around the reference value IC and reveals few fluctuations.

It should be noted that, if the current control implemented by the regulator stage 20n proves to be insufficient, the control circuit 15 can control the insertion in series of an additional active stage or the removal or replacement of one of the active stages by a different secondary stage.

An example embodiment of the current generator 10 shown in FIG. 1 is described here during a relaxation interval, i.e. between the generation of two consecutive current pulses.

For the implementation of a relaxation interval, the control circuit 15 imposes, for example, an OFF state on the switches Q1, Q2, Q3, Q4 of all the switching circuits 22, except for those of the switching circuit 22n of the regulator stage 20n.

The switches Q1n, Q2n, Q3n and Q4n are controlled in such a way as to establish a short circuit on the terminals of the regulator circuits 27a, 27b. For this purpose, the control circuit 15 imposes an ON state on the switches of at least one half-bridge of the switching circuit 22n.

For example, the control circuit 15 imposes an ON state on the switches Q1n and Q2n and an OFF state on the switches Q3n and Q4n. An ON state can also be imposed on Q1n, Q2n, Q3n and Q4n in order to divide the intensity of the current flowing in each of the two half-bridges.

Due to this short circuit in the half-bridge made up of the switches Q1n and Q2n, it is possible to cause a current to flow in the regulator stage without it flowing in the load Z and interfering with the measurement. It is furthermore evident in part c) of FIG. 2 that no current flows in the load Z during a relaxation interval.

Advantageously, the switches Qa, Qb of the regulator circuits 27a, 27b of the regulator stage 20n are controlled as during the pulse interval, in such a way as to regulate the intensities of the currents IA, IB flowing in the smoothing inductors La, Lb respectively around IC/2. Consequently, during a relaxation interval, the intensity of the current flowing in the switching circuit 22n in the switches Q1n and Q2n is regulated around the reference value IC.

This is advantageous since no substantial increase (or no reduction) in the intensity of the current flowing in the smoothing inductors La, Lb will occur during the establishment (or extinction) of a current pulse in the load Z, in such a way that said smoothing inductors La, Lb will have little or no impact on the durations of the current pulse establishment and extinction phases.

According to other examples, nothing excludes the possibility of regulating the intensity of the current flowing in the switching circuit 22n of the switches Q1n and Q2n around a non-zero value lower than the reference value IC. In fact, as long as the difference between this non-zero value and the reference value IC is less, as an absolute value, than the reference value IC, the current pulse establishment and extinction periods will be reduced compared with the case where the flow of the current is interrupted in the regulator stage 20n.

Furthermore, the respective switches Qa and Qb of the regulator circuits 27a, 27b can also be controlled alternately to the ON state during successive time intervals IT1, IT2 of the same duration. It should be noted that the duration of the time intervals IT1, IT2 is normally much less during a relaxation interval than the duration of these time intervals during a pulse interval. In fact, during a relaxation interval, the load Z is replaced by a very low impedance (short circuit) in such a way that the intensity of the current in a smoothing inductor Lb, Lb will increase/decrease much more quickly during a relaxation interval than during a pulse interval.

In a more general manner, the scope of the present invention is not limited to the embodiments described above by way of non-limiting examples.

For example, a current generator 10 has been described of which the regulator stage 20n comprises two regulator circuits 27a, 27b. This embodiment is particularly advantageous in that it represents a good compromise in terms of the number and size of the smoothing inductors La, Lb in relation to the precision of the regulation of the intensity of the current flowing in the load Z (by means of a suitable control of the switches Qa, Qb of said two regulator circuits). According to other examples, nothing excludes the possibility of considering a single regulator circuit (but to obtain the same inductance value—in henries—with a single smoothing inductor, the size of the latter will be greater), or of considering at least three regulator circuits mounted in parallel (more smoothing inductors of smaller sizes).

It is also possible to have a current generator comprising a plurality of regulator stages.

Furthermore, a current generator has been described of which the DC voltage sources of the secondary stages are secondary windings of a single-phase transformer, each comprising a diode rectifier bridge and a filtering capacitor. The implementation of the DC voltage sources (and the manner in which they are possibly powered) obviously goes beyond the scope of the invention and is considered to be within the reach of the person skilled in the art, and a particular implementation of the DC voltage sources only represents one implementation variant of a current generator according to the invention.

The invention claimed is:

1. A current generator for supplying regulated-intensity current pulses to terminals of a load, comprising:
   a plurality of secondary stages, each secondary stage comprising:
      a DC voltage source isolated from DC voltage sources of other secondary stages;
      a switching circuit comprising four switches disposed as two half-bridges, each formed from two switches mounted in series between terminals of the voltage source;
   wherein the switching circuits are interconnected to form a chain, a midpoint of a half-bridge of each secondary stage being connected to a midpoint of a half-bridge of a secondary stage downstream in the chain, each of two secondary stages at ends of the chain comprising the midpoint of a half-bridge configured to connect to a terminal of the load;
   wherein one of said plurality of secondary stages is designated as a regulator stage, comprises, between the DC voltage source and the switching circuit, a regulator circuit comprising a smoothing inductor, a switch disposed between a terminal of the smoothing inductor and the DC voltage source, and a circuit connecting the terminal of the smoothing inductor to the switching circuit when the switch of the regulator circuit is in an OFF state;
   a control circuit, during a generation of a current pulse, configured to:
      control the switches of the switching circuits of the secondary stages to dispose in series the DC voltage sources of a group of secondary stages, including the regulator stage, selected according to a current intensity reference value;
      isolate the DC voltage sources of unselected secondary stages; and
      control successive switching of the switch of the regulator circuit to regulate an intensity of a current flowing in the load around the current intensity reference value.

2. The current generator as claimed in claim 1, wherein the control circuit, between generation of two current pulses, is configured to control the switching circuit of the regulator stage to set all the switches of a half-bridge to an ON state; and to control successive switching of the switch of the regulator circuit to regulate the intensity of a current flowing in the switching circuit of the regulator stage around a non-zero value.

3. The current generator as claimed in claim 2, wherein the control circuit, between the generation of the two current pulses, is configured to regulate the intensity of the current flowing in the switching circuit of the regulator stage around the current intensity reference value.

4. The current generator as claimed in claim 1, wherein the regulator stage comprises, between the DC voltage source and the switching circuit, a plurality of regulator circuits mounted in parallel, each regulator circuit comprising:
   a smoothing inductor;
   a switch disposed between a terminal of the smoothing inductor and the DC voltage source,
   a circuit for connecting the terminal of the smoothing inductor to the switching circuit when the switch of the regulator circuit is in the OFF state; and
   wherein the control circuit, during a generation of a current pulse, is configured to control successive switching of respective switches of the regulator circuits of the regulator stage to regulate the intensity of the current flowing in the load around the current intensity reference value.

5. The current generator as claimed in claim 4, wherein a number of the regulator circuits of the regulator stage is equal to two and the smoothing inductors of the two regulator circuits have same characteristics; and wherein the control circuit, during the generation of the current pulse, is configured to control the respective switches of the two regulator circuits such that when the switch of one of the regular circuits is in an ON state, the switch of other regulator circuit is in an OFF state, the respective switches of the two regulator circuits being controlled alternately to the ON state during successive time intervals of same duration.

6. The current generator as claimed in claim 1, wherein the switches of the switching circuits and the switch of the regulator circuit are insulated gate bipolar transistors.

7. The current generator as claimed in claim 1, wherein the DC voltage sources of the secondary stages have a staging of their respective output voltages.

8. A method for generating current pulses on terminals of a load, comprising the steps of:
generating a current pulse by a current generator comprising a plurality of secondary stages, each secondary stage comprising:
a DC voltage source isolated from DC voltage sources of other secondary stages;
a switching circuit comprising four switches disposed as two half-bridges, each formed from two switches mounted in series between terminals of the voltage source;
wherein the switching circuits are interconnected to form a chain, a midpoint of a half-bridge of each secondary stage being connected to a midpoint of a half-bridge of a secondary stage downstream in the chain, each of two secondary stages at ends of the chain comprising the midpoint of a half-bridge configured to connect to a terminal of the load; and
wherein one of said plurality of secondary stages is designated as a regulator stage, comprises, between the DC voltage source and the switching circuit, a regulator circuit comprising a smoothing inductor, a switch disposed between a terminal of the smoothing inductor and the DC voltage source, and a circuit connecting the terminal of the smoothing inductor to the switching circuit when the switch of the regulator circuit is in an OFF state;
controlling the generation of the current pulse by the current generator by:
selecting a group of secondary stages designated as active stages in accordance with a current intensity reference value, which includes the regulator stage;
controlling the switches of the switching circuits of the secondary stages to dispose in series the DC voltage sources of the active stages and to isolate the DC voltage sources of unselected secondary stages; and
controlling successive switching of the switch of the regulator circuit to regulate an intensity of a current flowing in the load around the current intensity reference value.

9. The method as claimed in claim 8, between the generation of two current pulses, further comprising the steps of: controlling the switching circuit of the regulator stage to set all the switches of a half-bridge to an ON state; and controlling successive switching of the switch of the regulator circuit to regulate an intensity of a current flowing in the switching circuit of the regulator stage around a non-zero value.

10. The method as claimed in claim 8, wherein the regulator stage comprises two regulator circuits mounted in parallel and respective smoothing inductors of the two regulator circuits has same characteristics; and further comprising the step of controlling the respective switches of the two regulator circuits during the generation of the current pulse such that when the switch of one of the regular circuits is in an ON state, the switch of other regulator circuit is in an OFF state, the respective switches of the two regulator circuits being controlled alternately to the ON state during successive time intervals of same duration.

* * * * *